United States Patent
Aritome et al.

(10) Patent No.: US 8,711,630 B2
(45) Date of Patent: Apr. 29, 2014

(54) PROGRAMMING METHOD OF NON-VOLATILE MEMORY DEVICE

(75) Inventors: Seiichi Aritome, Gyeonggi-do (KR);
Hyun-Seung Yoo, Gyeonggi-do (KR);
Sung-Jin Whang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 224 days.

(21) Appl. No.: 13/334,423

(22) Filed: Dec. 22, 2011

(65) Prior Publication Data

US 2012/0170371 A1    Jul. 5, 2012

(30) Foreign Application Priority Data

Dec. 29, 2010 (KR) .......................... 10-2010-0137767
Nov. 8, 2011 (KR) .......................... 10-2011-0116067

(51) Int. Cl.
*G11C 16/04* (2006.01)

(52) U.S. Cl.
USPC ................................ 365/185.17; 365/185.28

(58) Field of Classification Search
USPC .............. 365/185.17, 185.28, 185.05, 185.18
See application file for complete search history.

(56) References Cited

U.S. PATENT DOCUMENTS

| 7,026,684 | B2 * | 4/2006 | Sakuma et al. | ............... 257/315 |
| 7,298,006 | B2 | 11/2007 | Arai et al. | |
| 7,342,279 | B2 * | 3/2008 | Harari et al. | ................... 257/324 |

FOREIGN PATENT DOCUMENTS

| JP | 08279297 | 10/1996 |
| JP | 11265589 | 9/2002 |
| JP | 2009193638 | 8/2009 |
| KR | 1020020071706 | 9/2002 |
| KR | 1020110015339 | 2/2011 |
| KR | 1020120094818 | 8/2012 |

OTHER PUBLICATIONS

Notice of Allowance issued by the Korean Intellectual Property Office on Nov. 19, 2012.
Ryota Katsumata, et al., "Pipe-shaped BiCS Flash Memory with 16 Stacked Layers and Multi-Level-Cell Operation for Ultra High Density Storage Devices," Symposium on VLSI Technology Digest of Technical Papers, 2009, pp. 136-137.
Jaehoon Jang, et al., "Vertical Cell Array using TCAT Technology for Ultra High Density NAND Flash Memory," Symposium on VLSI Technology Digest of Technical Papers, 2009, pp. 192-193.

* cited by examiner

*Primary Examiner* — Vu Le
(74) *Attorney, Agent, or Firm* — IP & T Group LLP

(57) ABSTRACT

A programming method of a non-volatile memory device that includes a string of memory cells with a plurality of floating gates and a plurality of control gates disposed alternately, wherein each of the memory cells includes one floating gate and two control gates disposed adjacent to the floating gate and two neighboring memory cells share one control gate. The programming method includes applying a first program voltage to a first control gate of a selected memory cell and a second program voltage that is higher than the first program voltage to a second control gate of the selected memory cell, and applying a first pass voltage to a third control gate disposed adjacent to the first control gate and a second pass voltage that is lower than the first pass voltage to a fourth control gate disposed adjacent to the second control gate.

20 Claims, 13 Drawing Sheets

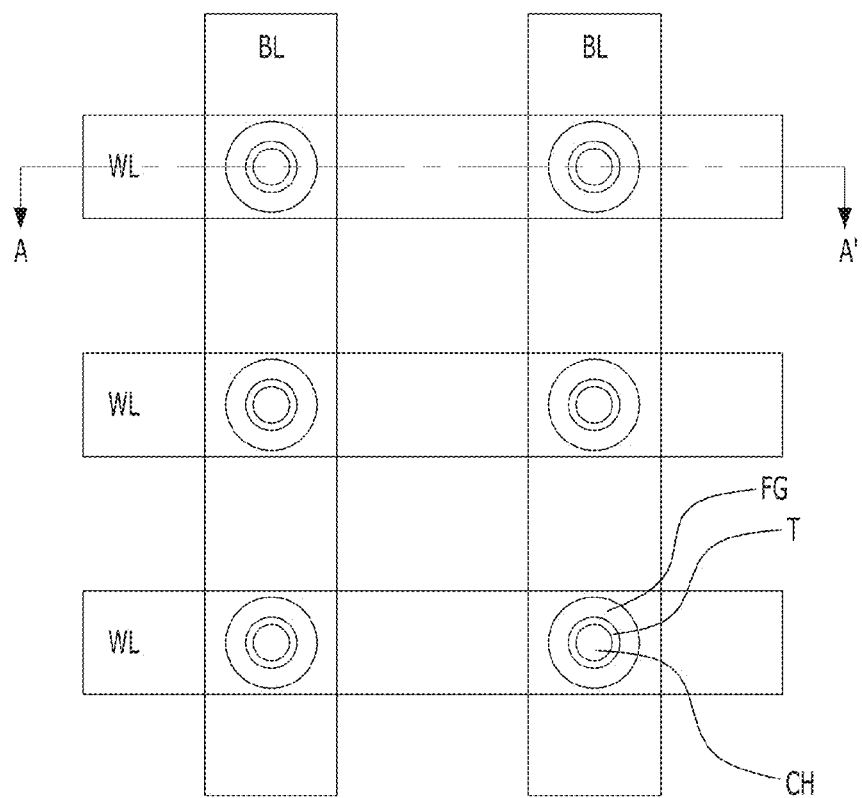

PROGRAMMING METHOD OF NON-VOLATILE MEMORY DEVICE

CROSS-REFERENCE TO RELATED APPLICATIONS

The present application claims priority of Korean Patent Application Nos. 10-2010-0137767 and 10-2011-0116067, filed on Dec. 29, 2010, and Nov. 8, 2011, respectively, which are incorporated herein by reference in its entirety.

BACKGROUND

1. Field

Exemplary embodiments of the present invention relate to a semiconductor technology, and more particularly, to a programming method of a non-volatile memory device.

2. Description of the Related Art

Non-volatile memory devices may retain data stored therein even though power supply is cut off. Each memory cell of a non-volatile memory device includes a floating gate that is controlled by a control gate and the non-volatile memory device stores or erases a data into/from the memory cell by accumulating or withdrawing (or discharging) electrons to/from the floating gate.

FIG. 1 is a circuit diagram illustrating a conventional non-volatile memory device. The conventional non-volatile memory device particularly has a structure that each memory cell includes one floating gate and two control gates that are disposed adjacent to the floating gate.

Referring to FIG. 1, the conventional non-volatile memory device includes a plurality of strings, bit lines BL that are coupled with first ends of the strings, and a source line SL that are coupled in common with second ends of the strings. Each string includes a drain selection transistor DST, a plurality of memory cells MC0 to MC3, and a source selection transistor SST that are serially coupled.

Gates of the drain selection transistors DST of the strings form a drain selection line DSL stretching in a first direction, and gates of the source selection transistors SST of the strings form a source selection line SSL stretching in the first direction.

Each of the memory cells MC0 to MC3 includes one floating gate FG and two control gates CG that are disposed adjacent to the floating gate FG. For example, a first memory cell MC0 includes a first floating gate FG0 and first and second control gates CG0 and CG1 on both sides of the first floating gate FG. The control gates CG of the strings on a line of a first direction form a word line WL.

The non-volatile memory device prevents crosstalk from being occurring between neighboring floating gates and has an increased coupling ratio between the control gates and the floating gate.

However, since the conventional non-volatile memory device has a structure that neighboring memory cells share one control gate, when a voltage is applied to two control gates of a selected memory cell for the memory cell to perform a program operation or a read operation, the data of the neighboring memory cell may be influenced.

In particular, when a program voltage is applied to two control gates of a selected memory cell during a program operation, adjacent memory cells may be applied with the program voltage through one of their control gates. As a result, a program disturbance phenomenon where the memory cell is programmed by the program operation of the adjacent memory cell occurs.

SUMMARY

An embodiment of the present invention is directed to a programming method for a non-volatile memory device that may prevent a program disturbance phenomenon from occurring in a non-volatile memory device having a structure where one unit memory cell includes one floating gate and two control gates disposed adjacent to the floating gate.

In accordance with an embodiment of the present invention, a programming method of a non-volatile memory device that includes a string of memory cells with a plurality of floating gates and a plurality of control gates disposed alternately, wherein each of the memory cells includes one floating gate and two control gates disposed adjacent to the floating gate and two neighboring memory cells share one control gate. The programming method includes: applying a first program voltage to a first control gate of a selected memory cell and a second program voltage that is higher than the first program voltage to a second control gate of the selected memory cell; and applying a first pass voltage to a third control gate disposed adjacent to the first control gate and a second pass voltage that is lower than the first pass voltage to a fourth control gate disposed adjacent to the second control gate.

In accordance with another embodiment of the present invention, a programming method of a non-volatile memory device that includes a plurality of floating gates and a multiple of control gates disposed alternately between a bit line and a source line. The programming method includes: applying a first program voltage to a first control gate adjacent to a selected floating gate and coupled between the selected floating gate and the bit line and a second program voltage that is higher than the first program voltage to a second control gate adjacent to the selected floating gate and coupled between the selected floating gate and the source line; and applying a first pass voltage to a third control gate adjacent to the first control gate and a second pass voltage that is lower than the first pass voltage to a fourth control gate adjacent to the second control gate.

BRIEF DESCRIPTION OF THE DRAWINGS

FIGS. 2A to 2D illustrate a non-volatile memory device in accordance with a first embodiment of the present invention.

DETAILED DESCRIPTION

Figure 1:
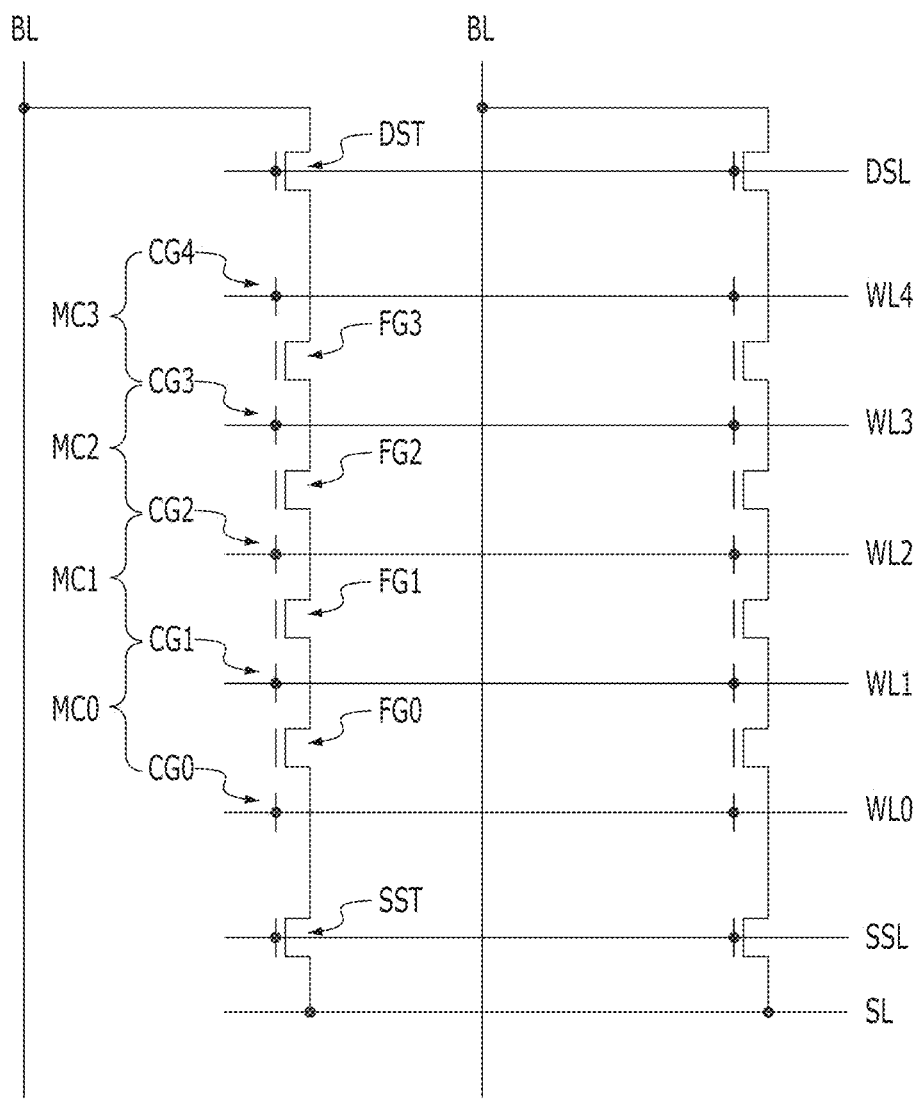
FIG. 1 is a circuit diagram illustrating a conventional non-volatile memory device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

An embodiment of the present invention discloses a programming method in a non-volatile memory device having a structure that one unit memory cell includes one floating gate and two control gates that are disposed adjacent to the floating gate. The structure may be employed in both of a two-dimensional non-volatile memory device where a plurality of memory cells are arrayed in a single layer over a semiconductor substrate and a three-dimensional non-volatile memory device where a plurality of memory cells are stacked perpendicularly to a substrate. Hereinafter, exemplary structures of non-volatile memory devices to which the programming method of the present invention may be applied are described, and the programming methods according to the embodiments of the present invention are described.

Figure 2B:
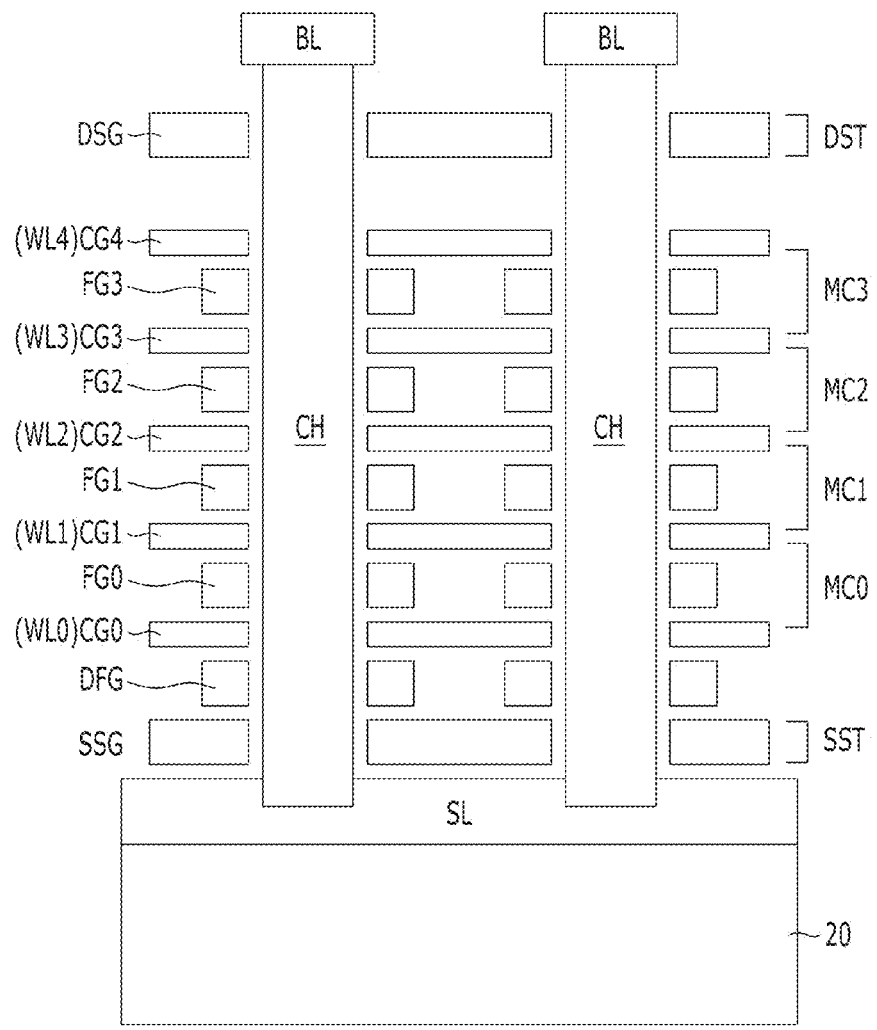
Figure 2C:
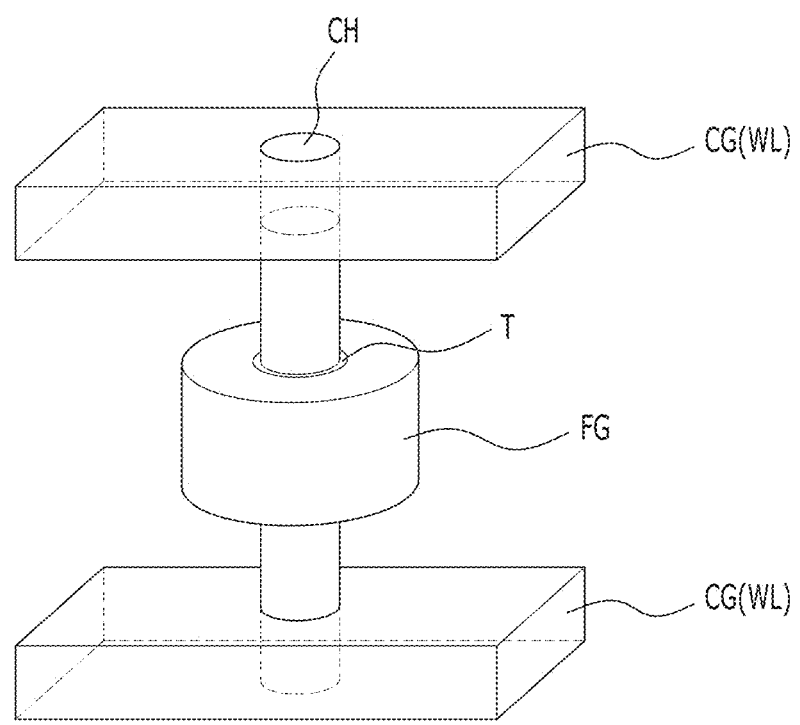
Figure 2D:
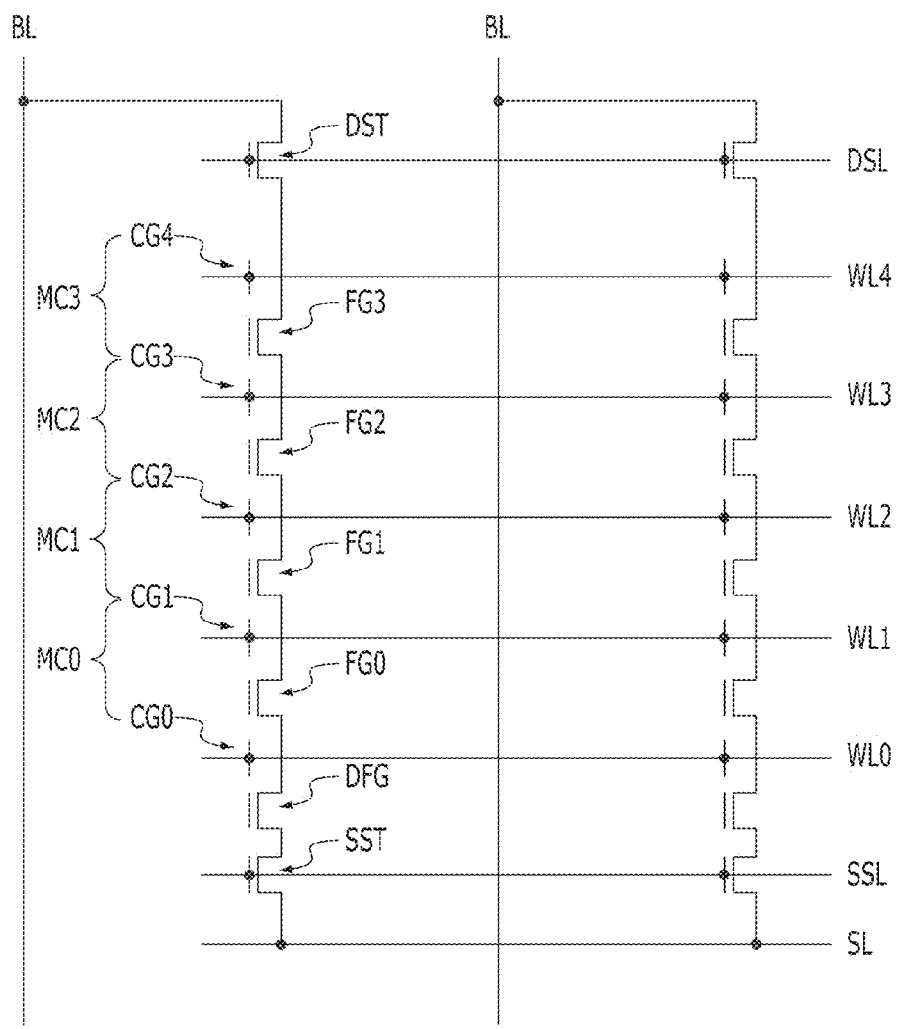

FIGS. 2A to 2D illustrate a non-volatile memory device in accordance with a first embodiment of the present invention. FIG. 2A is a plan view of the non-volatile memory device in accordance with the first embodiment of the present invention, and FIG. 2B is a cross-sectional view of the non-volatile memory device taken along an A-A' line of FIG. 2A. FIG. 2C is a perspective view of a unit memory cell shown in FIGS. 2A and 2B. FIG. 2D is an equivalent circuit diagram of the non-volatile memory device shown in FIG. 2B.

Referring to FIGS. 2A to 2D, the non-volatile memory device in accordance with the first embodiment of the present invention includes a plurality of channels CH that are formed over a substrate 20 having a source line SL and protrudes in a perpendicular direction from the substrate 20, and it further includes a plurality of floating gates FG and a plurality of control gates CG that are alternately stacked along the channels. Here, the floating gates FG have a ring shape surrounding the channels CH, and the control gates CG form word lines WL by being stretched in a first direction while surrounding the channels CH.

A unit memory cell MC, for example, a memory cell MC0, is formed of one floating gate that is in contact with one channel CH, for example, a floating gate FG0, and two control gates adjacent to the floating gate, for example, control gates CG0 and CG1. Here, a memory cell, for example, a second memory cell MC1, shares its control gates, for example, second and third control gates CG1 and CG2, with other two memory cells, for example, first and third memory cells MC0 and MC2, that are disposed adjacent to the upper and lower portions of the memory cell MC1. In other words, two adjacent memory cells, for example, memory cells MC0 and MC1, share one control gate, for example, a control gate CG1.

A tunnel insulation layer T is interposed between the floating gate FG and the channel CH for the tunneling of charges. Also, a charge blocking layer (not shown) is interposed between the floating gate FG and the control gate CG to block the transfer of charges therebetween. In addition, a gate insulation layer is interposed between the control gate CG and the channel CH. The tunnel insulation layer T or the charge blocking layer (not shown) may be disposed to serve as the gate insulation layer according to a semiconductor memory device fabrication process.

The channels CH may be arrayed in the form of matrix along the cross-sectional direction shown in the drawing and a direction crossing the cross-sectional direction shown in the drawing. The lower ends of the channels CH are in contact with the source line SL in common. Also, the upper ends of the channels CH are in contact with bit lines BL that are disposed over the channels CH and are stretched in a direction crossing the direction that the word lines WL are stretched.

A drain selection transistor DST is disposed over a plurality of memory cells, which are first to fourth memory cells MC0 to MC3, and a source selection transistor SST is disposed under the memory cells MC0 to MC3. To this end, a drain selection gate DSG that surrounds the channel CH with a gate insulation layer (not shown) disposed therebetween is disposed over the first to fourth memory cells MC0 to MC3, and the drain selection gate DSG is stretched in the first direction to form a drain selection line DSL. Also, a source selection gate SSG that surrounds the channel CH with the gate insulation layer (not shown) disposed therebetween is disposed under the first to fourth memory cells MC0 to MC3, and the source selection gate SSG is stretched in the first direction to form a source selection line SSL.

One channel CH and the source selection transistor SST, the first to fourth memory cells MC0 to MC3, and the drain selection transistor DST that are stacked along the channel CH constitute one string. The drain selection transistor DST controls the electrical connection between the string and a bit line BL in response to a voltage applied to the drain selection gate DSG, and the source selection transistor SST controls the electrical connection between the string and the source line SL in response to a voltage applied to the source selection gate SSG.

Meanwhile, the reference symbol 'DFG' represents a dummy floating gate. The dummy floating gate DFG may not function as floating gates of other memory cells. The dummy floating gate DFG may be omitted or interposed between the drain selection gate DSG and the uppermost control gate CG. The dummy floating gate DFG may be formed additionally during a process for fabricating the non-volatile memory device of the present invention, further description on it is not provided herein for the purpose of the description.

The non-volatile memory device in accordance with the first embodiment of the present invention, which is described above, has a three-dimensional structure where a plurality of memory cells are vertically stacked over a substrate and a structure where one unit memory cell includes one floating gate and two control gates that are disposed adjacent to the floating gate. The technology of the present invention is applicable to such structures of the non-volatile memory device, as described above.

Figure 3A:
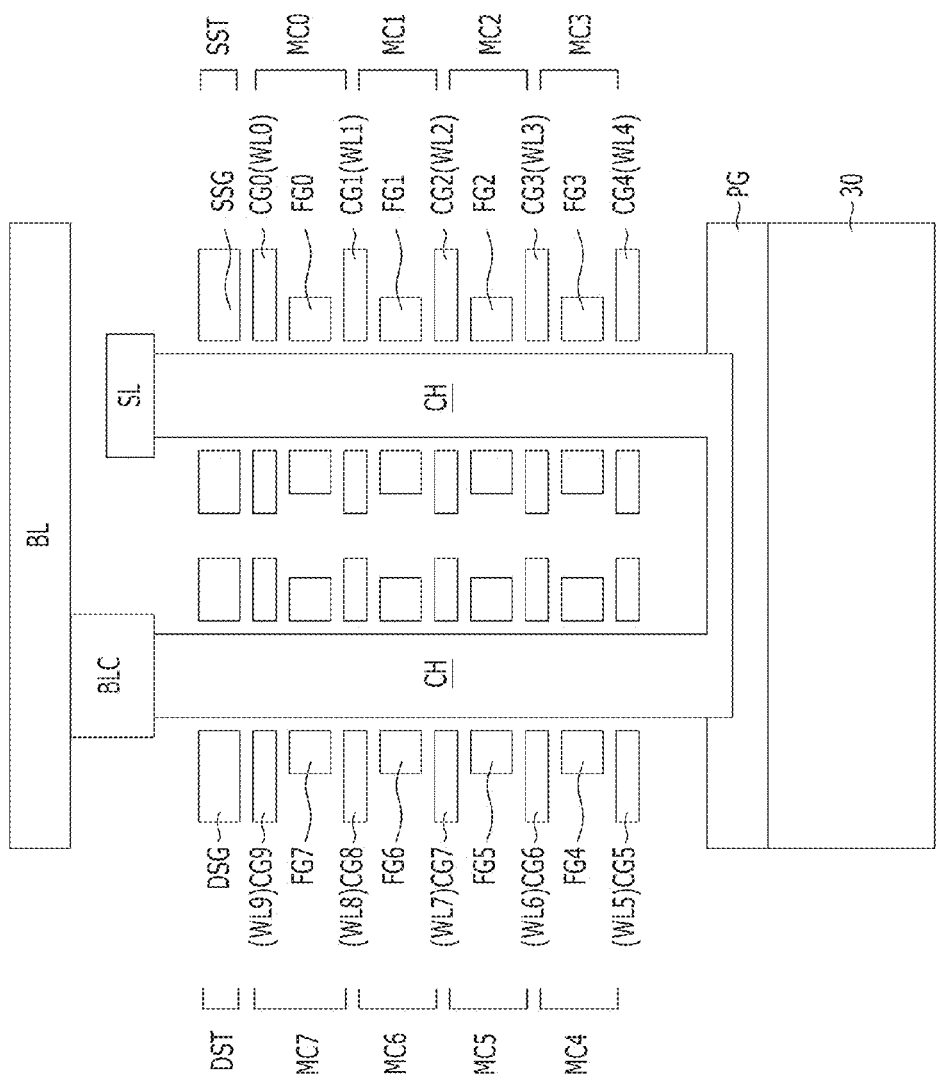
FIGS. 3A and 3B illustrate a non-volatile memory device in accordance with a second embodiment of the present invention.
Figure 3B:
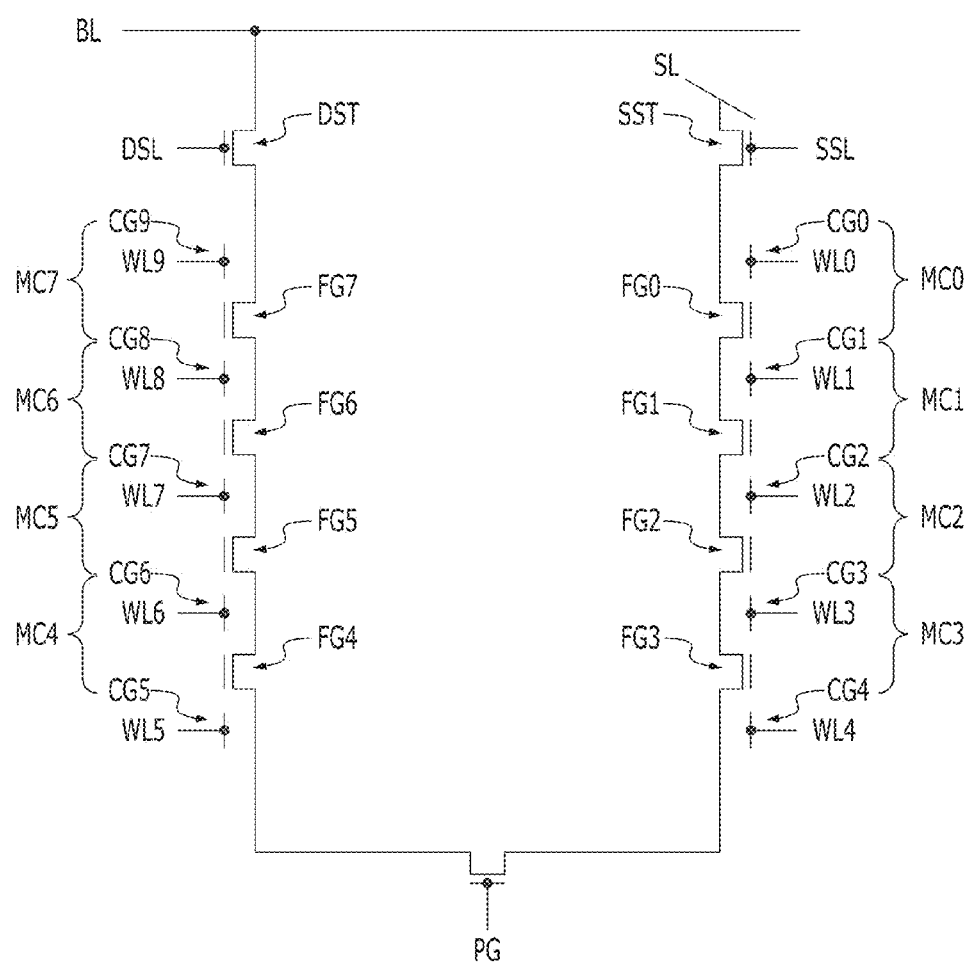

FIGS. 3A and 3B illustrate a non-volatile memory device in accordance with a second embodiment of the present invention. FIG. 3A is a cross-sectional view of the non-volatile memory device in accordance with the second embodiment of the present invention. FIG. 3B is an equivalent circuit diagram of the non-volatile memory device shown in FIG. 3A. Hereinafter, the same portions as those described in the first embodiment of the present invention are omitted and the technology of the present invention is described with focuses on the differences between the non-volatile memory device of the first embodiment and the non-volatile memory device of the second embodiment.

Referring to FIGS. 3A and 3B, the non-volatile memory device in accordance with the second embodiment of the present invention includes U-shaped channels CH that are formed over a substrate 30. Here, the U-shaped channels CH each include a pair of pillars that are vertically extending from the substrate 30 and a connector that connects the lower portions of the pillars to each other. The connector is disposed over the substrate 30 and controlled by a pipe gate PG that surrounds the side surfaces and lower surface of the connector. A gate insulation layer (not shown) may be interposed between the pipe gate PG and the connector.

A plurality of floating gates FG and a plurality of control gates CG are alternately stacked along each pair of the pillars of the channels CH. Here, the floating gates FG have a shape of ring surrounding a channel CH, and the control gates CG form word lines WL by being stretched in a direction crossing the cross-sectional direction shown in the drawing while surrounding each pillar of the channels CH. The formation of one unit memory cell, (for example, MC0) which includes one floating gate (for example, FG0) that is in contact with one channel CH and the two control gates (for example, CG0 and CG1) that are disposed adjacent to the upper and lower portions of the floating gate, is substantially the same as the first embodiment described before. Also, the formations of a tunnel insulation layer T, a charge blocking layer, and a gate insulation layer are substantially the same as the first embodiment as well.

The upper end of one pillar of a pair of pillars of a channel CH is in contact with a bit line BL that is stretched in the cross-sectional direction shown in the drawing, and the upper end of the other pillar of the pair of pillars of the channel CH is in contact with a source line SL that is stretched in a direction crossing the cross-sectional direction shown in the drawing. Since the stretching directions of the bit line BL and the source line SL are different from each other, the bit line BL may be disposed in a different layer from the source line SL, for example, the bit line BL may be disposed over the source line SL. Accordingly, the bit line BL is coupled with the upper end of one pillar of the pair of pillars by disposing a bit line contact BLC.

A drain selection transistor DST and the source selection transistor SST are disposed over the uppermost memory cell MC7 that surrounds one pillar and the uppermost memory cell MC0 that surrounds the other pillar. To this end, a drain selection gate DSG surrounding a channel CH with a gate insulation layer (not shown) disposed therebetween is disposed over the eighth memory cell MC7, and the drain selection gate DSG is stretched in a direction crossing the cross-sectional direction shown in the drawing to form a drain selection line DSL. Also, a source selection gate SSG surrounding a channel CH with a gate insulation layer (not shown) disposed therebetween is formed over the first memory cell MC0, and the source selection gate SSG is stretched in a direction crossing the cross-sectional direction shown in the drawing to form a source selection line SSL.

One channel CH and the source selection transistor SST, the multiple memory cells MC0 to MC7, and the drain selection transistor DST that is formed along the channel CH constitute one U-shaped string. Here, the connection between the fifth to eighth memory cells MC4 to MC7 that are formed along one pillar of the channel CH and the first to fourth memory cells MC0 to MC3 that are formed along the other pillar may be controlled based on the voltage applied to a pipe gate PG. The drain selection transistor DST controls the electrical connection between the bit line BL and the string based on the voltage applied to the drain selection gate DSG, and the source selection transistor SST controls the electrical connection between the source line SL and the string based on the voltage applied to the source selection gate SSG.

Similar to the non-volatile memory device in accordance with the first embodiment of the present invention, the non-volatile memory device in accordance with the second embodiment of the present invention has a three-dimensional structure where a plurality of memory cells are vertically stacked over a substrate and at the same time has a structure where one unit memory cell includes one floating gate and two control gates that are disposed adjacent to the floating gate. Furthermore, compared with the non-volatile memory device in accordance with the first embodiment of the present invention, the non-volatile memory device in accordance with the second embodiment of the present invention includes more memory cells in one string. Therefore, the non-volatile memory device in accordance with the second embodiment of the present invention has a higher degree of integration. As described above, the technology of the present invention may be applied to such structures of the non-volatile memory device.

Figure 4A:
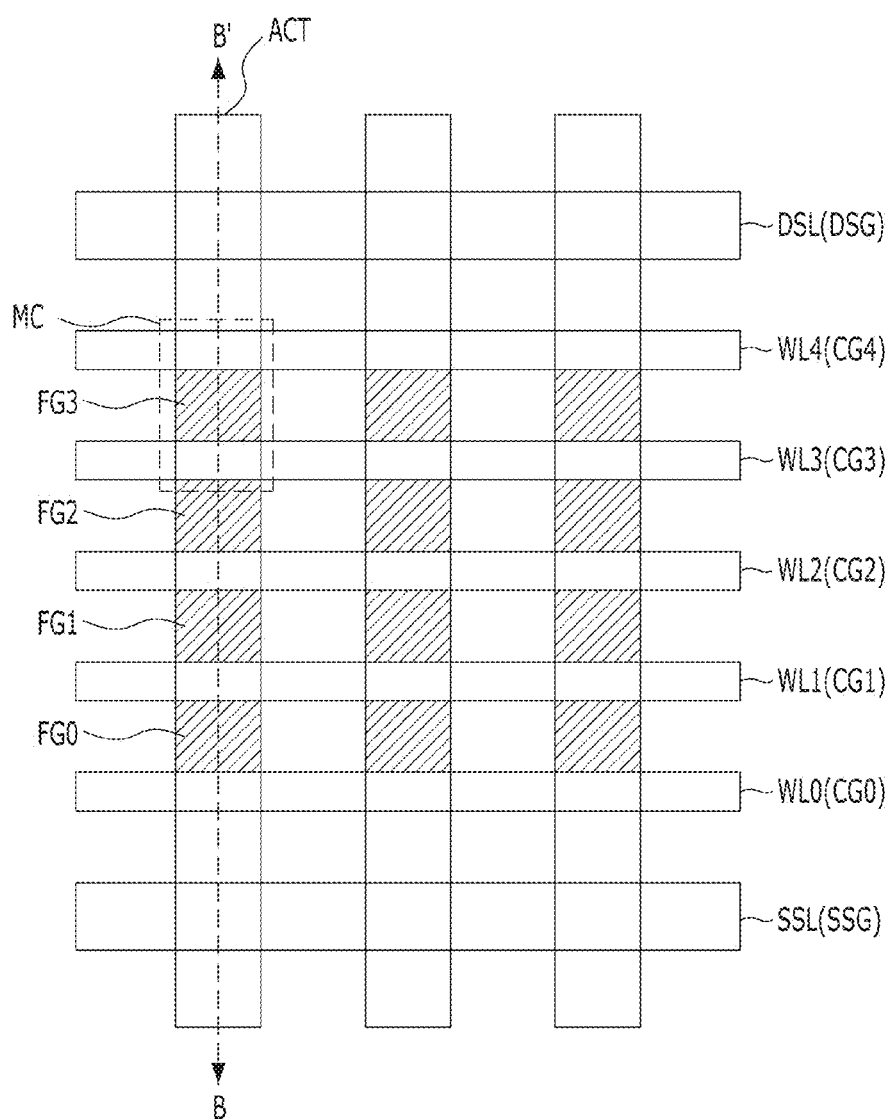
FIGS. 4A and 4B illustrate a non-volatile memory device in accordance with a third embodiment of the present invention.
Figure 4B:
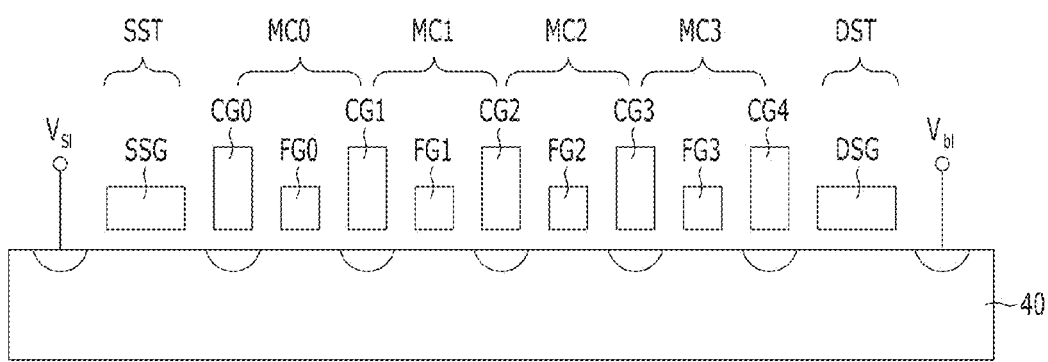

FIGS. 4A and 4B illustrate a non-volatile memory device in accordance with a third embodiment of the present invention. FIG. 4A is a plan view of the non-volatile memory device in accordance with the third embodiment of the present invention, and FIG. 4B is cross-sectional view of the non-volatile memory device taken along a B-B' line of FIG. 4A. The same portions as those in the first embodiment of the present invention described above are omitted, and the description is provided with focuses on the difference.

Referring to FIGS. 4A and 4B, the non-volatile memory device in accordance with the third embodiment of the present invention includes a drain selection line DSL, a plurality of word lines WL0 to WL4, and a source selection line SSL that are formed over a semiconductor substrate 40 and stretched in a direction and a plurality of floating gates FG disposed between the word lines WL0 to WL4. Here, the drain selection line DSL, the word lines WL0 to WL4, and the source selection line SSL are formed to go across a plurality of active regions ACT that are defined in the semiconductor substrate 40. The floating gates FG are disposed over the active regions ACT between the word lines WL0 to WL4 to have an island shape.

Here, a unit memory cell MC, for example, a first memory cell MC0, is formed of one floating gate FG, for example a first floating gate FG0, and two control gates CG, for example, first and second control gates CG0 and CG1, that are disposed adjacent to both sides of the first floating gate FG0 in the B-B' direction. Here, the control gates CG, for example, the second and third control gates CG1 and CG2, included in any one memory cell, for example, a second memory cell MC1, are shared by the neighboring memory cells MC, for example, the memory cells MC0 and MC2. In other words, two neighboring memory cells MC, for example, the first and second memory cells MC0 and MC1, share one control gate CG, for example, the second control gate CG1.

A tunnel insulation layer (not shown) for tunneling of charges is interposed between the floating gates FG and the semiconductor substrate 40, and a charge blocking layer (not shown) for blocking the transfer of charges is interposed between the floating gates FG and the control gates CG. A gate insulation layer (not shown) is interposed between the control gates CG and the semiconductor substrate 40. The gate insulation layer (not shown) is also interposed between the source selection gate SSG and the semiconductor substrate 40 and between the drain selection gate DSG and the semiconductor substrate 40. Although not illustrated in the drawing, an insulation layer may be formed between the floating gates FG on a line of a direction crossing the B-B' direction.

The active regions ACT on one side of the drain selection line DSL are coupled with a bit line Vbl (see FIG. 4B) stretched in a direction through a drain contact (not shown). Also, the active regions ACT on one side of the source selection line SSL are coupled with a source line Vsl (see FIG. 4B) stretched in a direction through a source contact (not shown).

A drain selection transistor DST, a plurality of memory cells MC0 to MC3, and a source selection transistor SST that are overlapped with one active region ACT constitute one string. The drain selection transistor DST on one side of the memory cells MC0 to MC3 controls the electrical connection between a bit line BL and the string based on the voltage applied to the drain selection gate DSG, and the source selection transistor SST on the other side of the memory cells MC0 to MC3 controls the electrical connection between a source line SL and the string based on the voltage applied to the source selection gate SSG.

The non-volatile memory device in accordance with the third embodiment of the present invention that is described above has a two-dimensional structure where a plurality of memory cells are arrayed in a single layer over a substrate and at the same time has a structure where one unit memory cell includes one floating gate and two control gates that are disposed adjacent to the floating gate. As described above, the technology of the present invention may be applied to such a structure of the non-volatile memory device.

The non-volatile memory devices in accordance with the first to third embodiments of the present invention have in common a structure of sharing control gates. Hereinafter, a programming method for storing data in a selected memory cell in such a structure is described in accordance with the embodiments of the present invention.

Figure 5:
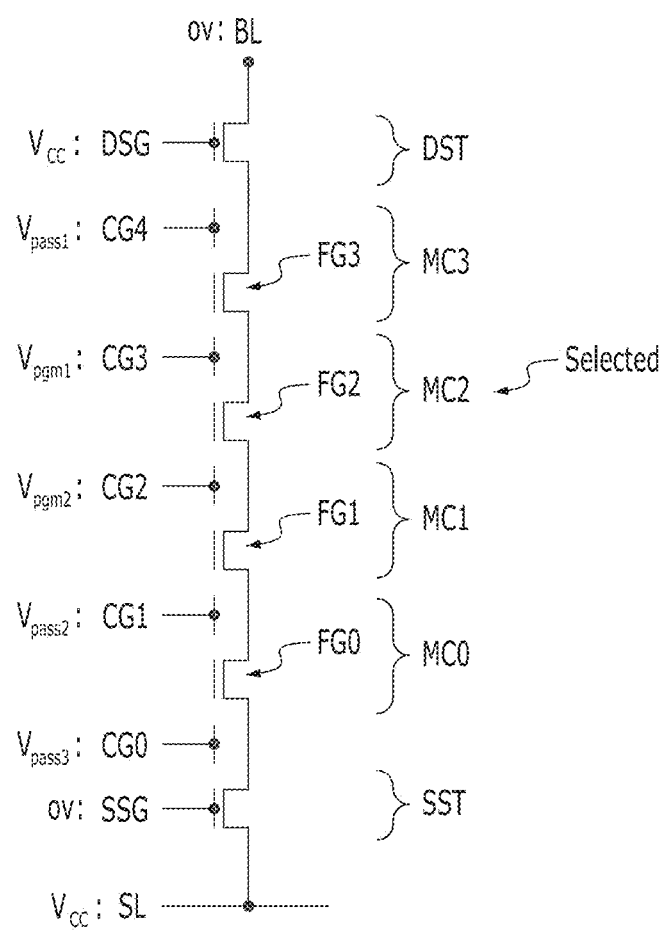
FIG. 5 is a circuit diagram illustrating a program operation of a non-volatile memory device in accordance with a third embodiment of the present invention.

FIG. 5 is a circuit diagram illustrating a program operation of a non-volatile memory device in accordance with an embodiment of the present invention. While one string including the selected memory cell is illustrated in the drawing, one string including four memory cells is described as an example. Also, a third memory cell MC2 is selected as an example for illustration purposes among the four memory cells, which are first to fourth memory cells MC0 to MC3.

Referring to FIG. 5, the selected memory cell MC2 is programmed by applying program voltages $V_{pgm2}$ and $V_{pgm1}$ to the control gates CG2 and CG3 of the selected memory cell MC2 and applying pass voltages $V_{pass3}$, $V_{pass2}$ and $V_{pass1}$ to the control gates CG0, CG1 and CG4 of the unselected memory cells MC0, MC1 and MC3, while applying approximately 0 V to a bit line BL; applying a voltage that may completely turn on a drain selection transistor DST, for example, a power source voltage $V_{cc}$, to a drain selection gate DSG; and applying a voltage that may disconnect a source line SL from a corresponding string, for example, approximately 0V, to a source selection gate SSG. Here, although not illustrated in the drawing, a program inhibition bit line voltage, for example, the power source voltage $V_{cc}$, may be applied to the bit lines coupled with the other strings that does not include the selected memory cell, and accordingly, the unselected memory cells sharing the control gates CG2 and CG3 with the selected memory cell MC2 in the other strings may be prevented from being programmed.

Here, since the program voltages $V_{pgm2}$ and $V_{pgm1}$ are high positive voltages, the levels of the pass voltages $V_{pass2}$ and $V_{pass1}$ that are applied to the control gates CG1 and CG4 of the neighboring memory cells MC1 and MC3 may be low, more specifically, may have negative values in order to prevent negative charges from transferring into the floating gates FG1 and FG3 of the neighboring memory cells MC1 and MC3 that are disposed adjacent to the selected memory cell MC2.

Meanwhile, since the voltage that is applied to the bit line BL, which is approximately 0V, is to be transferred at least to the channel of the selected memory cell MC2, the drain selection transistor DST and the neighboring memory cell MC3 are to be turned on. For the neighboring memory cell MC3 to be turned on, the pass voltage $V_{pass1}$ applied to the fifth control gate CG4 is to be equal to or higher than a sum of the voltage applied to the bit line BL and the threshold voltage of the fourth memory cell MC3. For example, a positive voltage of approximately 2V or higher may be applied as the pass voltage $V_{pass1}$. Therefore, as described above, there is limitation in decreasing the voltage applied to the fifth control gate CG4 to prevent an occurrence of program disturbance, and the voltage applied to the fifth control gate CG4 may not have a negative value.

On the other hand, the voltage applied to the bit line BL, which is approximately 0V, is transferred to the channel of the selected memory cell MC2 and may not be transferred to the memory cell MC0. This is because although the selected memory cell MC2 is disconnected from the other memory cell MC0, it does not have any influence on the program operation. The voltage $V_{pass2}$ that is applied to the second control voltage CG1 may be decreased as low as possible and the voltage $V_{pass2}$ that is applied to the second control voltage CG1 may have a negative voltage.

Therefore, in this embodiment of the present invention, a program method that may easily transfer a bit line voltage to the channel of a selected memory cell while preventing an occurrence of program disturbance is disclosed hereinafter.

A pass voltage $V_{pass1}$ of a level that may turn on the neighboring memory cell MC3, for example, approximately 2V, is applied to the fifth control gate CG4 of the fourth memory cell MC3 that is adjacent to the selected memory cell MC2 toward the bit line BL. Program disturbance may occur, that is, electrons may transfer into a fourth floating gate FG3 due to the influence of a program voltage $V_{pass1}$ applied to the fourth control gate CG3 because the pass voltage $V_{pass1}$ is not sufficiently low, but the program disturbance may be prevented from occurring by decreasing the program voltage $V_{pgm1}$ that is applied to the fourth control gate CG3. The decrease in the programming speed that may occur by decreasing the program voltage $V_{pgm1}$ may be compensated for by raising the program voltage $V_{pgm2}$ applied to the third control gate CG2 of the selected memory cell MC2 disposed toward the source line SL to be relatively higher than the program voltage $V_{pgm1}$. When the program voltage $V_{pgm2}$ is relatively high, the program disturbance that electrons are transferred into a neighboring second floating gate FG1 may occur, but the occurrence of the program disturbance may be prevented by sufficiently decreasing the pass voltage $V_{pass2}$ that is applied to the second control gate CG1. This is because the program operation may be properly performed even when the second memory cell MC1 adjacent to the selected memory cell MC2 toward the source line SL is turned off, as described above, and there is no lower limit to the voltage applied to the second control gate CG1.

To sum up, the following Equation 1 is obtained.

$$V_{pgm2} > V_{pgm1} > V_{pass1} > V_{pass2} \qquad \text{Equation 1}$$

In short, in exchange for decreasing the program voltage $V_{pgm1}$ applied to the fourth control gate CG3 toward the bit line BL lower than the voltage applied to the third control gate CG2 toward the source line SL, among the control gates CG2 and CG3 of the selected memory cell MC2, the pass voltage $V_{pass1}$ applied to the fifth control gate CG4 of the fourth memory cell MC3 toward the bit line BL is raised higher than the pass voltage $V_{pass2}$ applied to the second control gate CG1 of the second memory cell MC1 toward the source line SL, among the memory cells MC1 and MC3 adjacent to the selected memory cell MC2.

Here, the specific voltage conditions may be modified differently. For example, the voltage conditions shown in the following Table 1 may be provided. In consideration of both programming speed and program disturbance in Table 1, Case 3 may be the optimal case because the sum of the program voltage $V_{pgm1}$ and the program voltage $V_{pgm2}$ is great, the difference between the program voltage $V_{pgm1}$ and the pass voltage $V_{pass1}$ is small, and the difference between the program voltage $V_{pgm2}$ and the pass voltage $V_{pass2}$ is great simultaneously. However, the concept and scope of the present invention are not limited to the specific voltage values.

TABLE 1

| Case | 1 | 2 | 3 | 4 | 5 |
|---|---|---|---|---|---|
| $V_{pgm2}$ | 18 V | 20 V | 22 V | 20 V | 20 V |
| $V_{pgm1}$ | 14 V | 12 V | 14 V | 16 V | 16 V |
| $V_{pass1}$ | 2 V | 4 V | 2 V | 2 V | 2 V |
| $V_{pass2}$ | -2 V | -4 V | -3 V | 0 V | -2 V |

Meanwhile, a typical pass voltage of a level that may sufficiently turn on a corresponding memory cell, for example, approximately 10V, is applied to the first control gate CG0 of the remaining memory cell MC0 other than the selected memory cell MC2 and the memory cells MC1 and MC3 adjacent to the selected memory cell MC2, and this is denoted with a pass voltage $V_{pass3}$. Although the pass voltage $V_{pass3}$ is applied only to the first control gate CG0 because one string includes four memory cells in the exemplary embodiment, the pass voltage $V_{pass3}$ may be applied to the control gates CG of all the other memory cells except for the selected and adjacent memory cells. The pass voltage $V_{pass3}$ may be higher than the pass voltages $V_{pass1}$ and $V_{pass2}$ and lower than the program voltage $V_{pgm1}$.

It is experimentally confirmed in the program operation described above that the program disturbance is prevented from occurring compared to conventional technology. Hereinafter, this is described in detail with reference to FIGS. 6A to 6C.

Figure 6A:
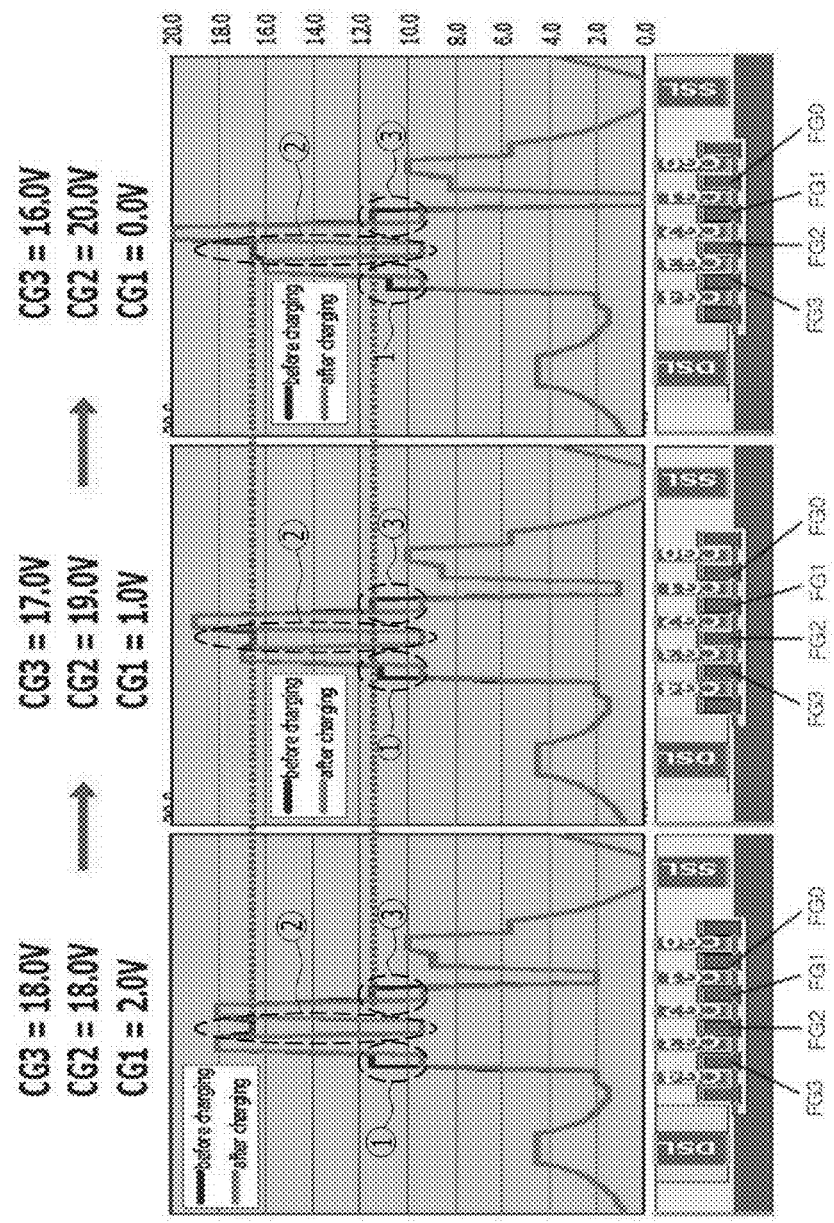
FIGS. 6A to 6C show the effect of a programming method of a non-volatile memory device in accordance with an embodiment of the present invention.
Figure 6B:
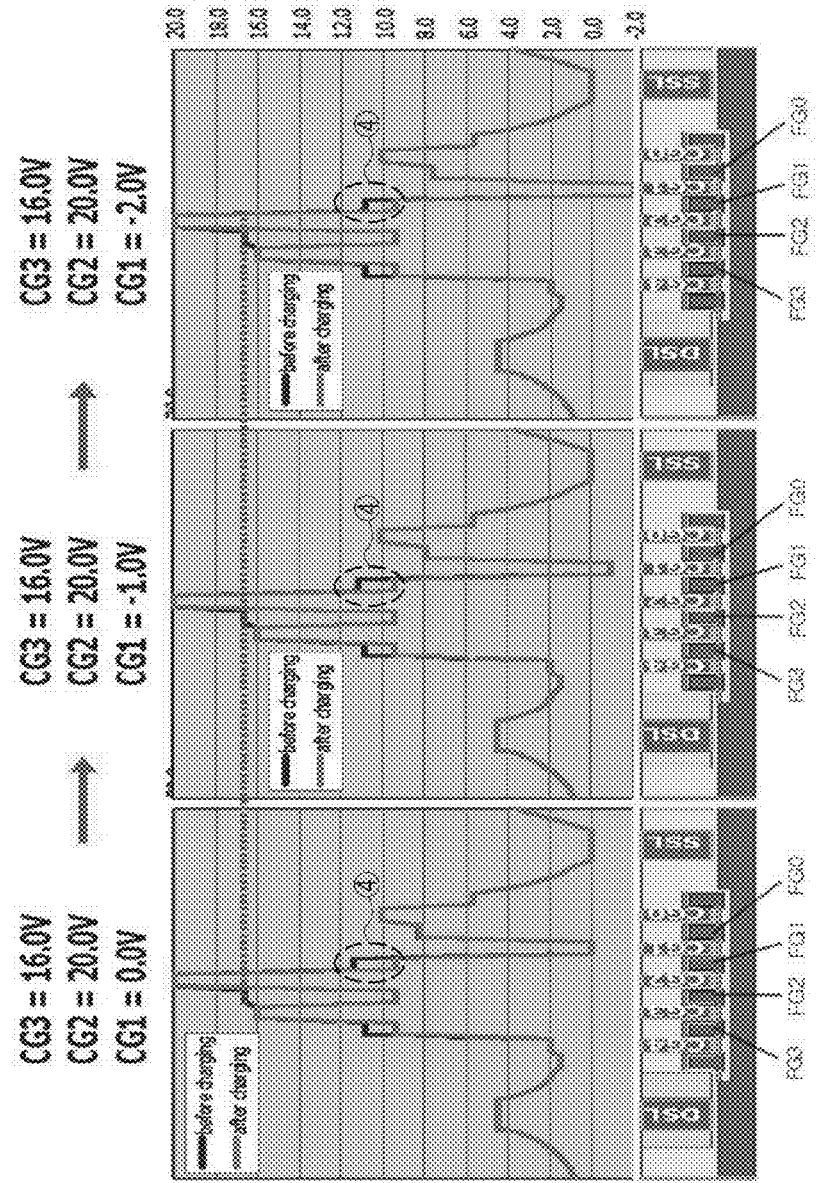
Figure 6C:
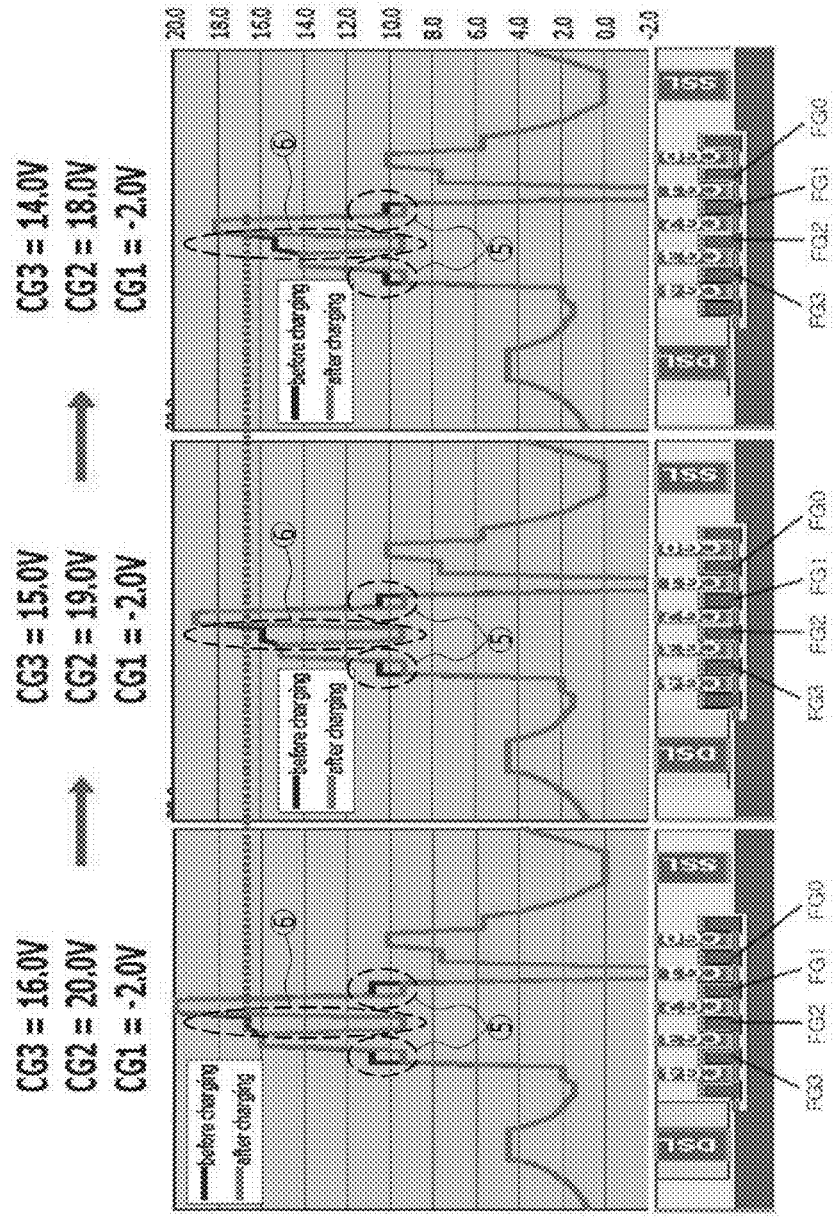

FIGS. 6A to 6C show the effect of a programming method of a non-volatile memory device in accordance with an embodiment of the present invention.

FIG. 6A shows a graph illustrating the change in the voltage levels of the floating gates FG when a program voltage applied to the fourth control gate CG3 is decreased such as approximately 18V, 17V and 16V, a program voltage applied to the third control gate CG2 is increased such as approximately 18V, 19V and 20V, and a program voltage applied to the second control gate CG1 is decreased such as approximately 2V, 1V and 0V, while maintaining a pass voltage applied to the fifth control gate CG4 at approximately 2V and maintaining a pass voltage applied to the first control gate CG0 at approximately 10V.

Referring to FIG. 6A, the amount of the electrons (refer to) transferred into the fourth floating gate FG3 of a neighboring memory cell MC3 is gradually decreased as the program voltage applied to the fourth control gate CG3 of a program target memory cell MC2 is gradually decreased (approximately 18V, 17V, and 16V).

Also, although the program voltage applied to the fourth control gate CG3 of the program target memory cell MC2 is gradually decreased (approximately 18V, 17V, and 16V), when the program voltage applied to the third control gate CG2 is gradually increased (approximately 18V, 19V, and 20V), the amount of the electrons (refer to) transferred into the third floating gate FG2 of a program target memory cell MC2 is maintained uniformly. In short, the programming performance is maintained as it is.

Furthermore, although the program voltage applied to the third control gate CG2 of the program target memory cell MC2 is gradually increased (approximately 18V, 19V, and 20V), when the pass voltage applied to the second control gate CG1 of the neighboring memory cell MC1 is gradually decreased (approximately 2V, 1V, and 0V), the amount of the electrons (refer to) transferred into the second floating gate FG1 of the neighboring memory cell MC1 is maintained uniformly. In short, despite the increase in the program voltage applied to the third control gate CG2, program disturbance may not occur.

FIG. 6B shows a graph illustrating the change in the voltage levels of the floating gates FG when a pass voltage applied to the second control gate CG1 is decreased such as approximately 0V, -1V and -2V, while maintaining a pass voltage applied to the fifth control gate CG4 at approximately 2V, maintaining a pass voltage applied to the first control gate CG0 at approximately 10V, maintaining a program voltage applied to the fourth control gate CG3 at approximately 16V, and maintaining a program voltage applied to the third control gate CG2 at approximately 20V.

Referring to FIG. 6B, the amount of the electrons (refer to) transferred into the second floating gate FG1 is decreased more by applying a negative voltage to the second control gate CG1, although the program voltage applied to the third control gate CG2 is as high as approximately 20V. Therefore, the occurrence of program disturbance may be prevented more strongly.

FIG. 6C shows a graph illustrating the change in the voltage levels of the floating gates FG when a program voltage applied to the third control gate CG2 and the fourth control gate CG3 is decreased overall, while maintaining a pass voltage applied to the fifth control gate CG4 at approximately 2V, maintaining a pass voltage applied to the first control gate CG0 at approximately 10V, and maintaining a pass voltage applied to the second control gate CG1 at approximately -2V.

Referring to FIG. 6C, the occurrence of the program disturbance is reduced (refer to) as the program voltage applied to the third control gate CG2 and the fourth control gate CG3 is decreased, but the programming speed is also decreased as well (refer to). Therefore, the level of the program voltage is to be controlled at an appropriate level in consideration of both desired programming speed and program disturbance. In particular, since the voltage applied to the fifth control gate CG4 is to be a pass voltage over a certain level, and accordingly, the program voltage applied to the fourth control gate CG3 is to be lower than a set level, it is preferable to control the pass voltage applied to the second control gate CG1 has to be decreased while increasing the program voltage applied to the third control gate CG2.

The programming method for a non-volatile memory device in accordance with an embodiment of the present invention may prevent a program disturbance phenomenon from occurring in a non-volatile memory device having a structure that one unit memory cell includes one floating gate and two control gates disposed adjacent to the floating gate.

While the present invention has been described with respect to the specific embodiments, it will be apparent to those skilled in the art that various changes and modifications may be made without departing from the spirit and scope of the invention as defined in the following claims.

What is claimed is:

1. A programming method of a non-volatile memory device that includes a string of memory cells with a plurality of floating gates and a plurality of control gates disposed alternately, wherein each of the memory cells includes one floating gate and two control gates disposed adjacent to the floating gate and two neighboring memory cells share one control gate, the programming method comprising:
 applying a first program voltage to a first control gate of a selected memory cell and a second program voltage that is higher than the first program voltage to a second control gate of the selected memory cell; and
 applying a first pass voltage to a third control gate disposed adjacent to the first control gate and a second pass voltage that is lower than the first pass voltage to a fourth control gate disposed adjacent to the second control gate.

2. The programming method of claim 1, wherein the non-volatile memory device further comprises a drain selection transistor and a source selection transistor that are disposed on both ends of the memory cells,
 wherein the drain selection transistor controls a connection between the memory cells and a bit line, and
 the source selection transistor controls a connection between the memory cells and a source line.

3. The programming method of claim 2, wherein the first control gate is disposed toward the bit line and the second control gate is disposed toward the source line.

4. The programming method of claim 3, wherein the drain selection transistor is turned on.

5. The programming method of claim 1, wherein the second pass voltage is a negative voltage.

6. The programming method of claim 1, further comprising:
 applying a third pass voltage that is higher than the first pass voltage and the second pass voltage to the remaining control gates other than the first to fourth control gates.

7. The programming method of claim 1, wherein the second program voltage is increased as the first program voltage is decreased.

8. The programming method of claim 1, wherein the second pass voltage is decreased as the second program voltage is increased.

9. The programming method of claim 8, wherein the first pass voltage is maintained at a set level.

10. The programming method of claim 1, wherein the plurality of floating gates and the plurality of control gates are alternately stacked along a channel protruded from a substrate.

11. A programming method of a non-volatile memory device that includes a plurality of floating gates and a plurality of control gates disposed alternately between a bit line and a source line, the programming method comprising:
 applying a first program voltage to a first control gate adjacent to a selected floating gate and coupled between the selected floating gate and the bit line and a second program voltage that is higher than the first program voltage to a second control gate adjacent to the selected floating gate and coupled between the selected floating gate and the source line; and
 applying a first pass voltage to a third control gate adjacent to the first control gate and a second pass voltage that is lower than the first pass voltage to a fourth control gate adjacent to the second control gate.

12. The programming method of claim 11, wherein the plurality of floating gates and the plurality of control gates are alternately stacked along a channel extending from a substrate.

13. The programming method of claim 12, wherein the non-volatile memory device further comprises:
 a drain selection transistor and a source selection transistor that are formed at upper and lower ends of the plurality of floating gates and the plurality of control gates along the channel,
 wherein the source line is formed over the substrate and in contact with a lower surface of the channel, and
 the bit line is formed in contact with an upper surface of the channel.

14. The programming method of claim 12, wherein the channel comprises a pair of a first channel and a second channel, and
 the first channel and the second channel are coupled with each other through a connection channel formed under the first channel and the second channel.

15. The programming method of claim 13, wherein the drain selection transistor is turned on.

16. The programming method of claim 11, wherein the second pass voltage is a negative voltage.

17. The programming method of claim 11, further comprising:
 applying a third pass voltage that is higher than the first pass voltage and the second pass voltage to the remaining control gates other than the first to fourth control gates.

18. The programming method of claim 11, wherein the second program voltage is increased as the first program voltage is decreased.

19. The programming method of claim 11, wherein the second pass voltage is decreased as the second program voltage is increased.

20. The programming method of claim 19, wherein the first pass voltage is maintained at a set level.

* * * * *

UNITED STATES PATENT AND TRADEMARK OFFICE
CERTIFICATE OF CORRECTION

Page 1 of 1

PATENT NO. : 8,711,630 B2
APPLICATION NO. : 13/334423
DATED : April 29, 2014
INVENTOR(S) : Seiichi Aritome et al.

It is certified that error appears in the above-identified patent and that said Letters Patent is hereby corrected as shown below:

On the Title Page, Item (56)

Change the References Cited section as follows:

FOREIGN PATENT DOCUMENTS

| JP | 08279297 | 10/1996 |
| JP | 11265589 | 9/1999 |
| JP | 2009193638 | 8/2009 |
| KR | 1020020071706 | 9/2002 |
| KR | 1020110015339 | 2/2011 |
| KR | 1020120094818 | 8/2012 |

Signed and Sealed this
First Day of July, 2014

Michelle K. Lee
*Deputy Director of the United States Patent and Trademark Office*